US00RE45468E

(19) United States
(12) Reissued Patent
Chen et al.

(10) Patent Number: US RE45,468 E
(45) Date of Reissued Patent: Apr. 14, 2015

(54) BARRIER-SLURRY-FREE COPPER CMP PROCESS

(75) Inventors: Yi-Chen Chen, Gueishan Township (TW); Ching-Ming Tsai, Fongtian Jhuolan Township (TW); Ray-Ting Chang, Lujou Taipei (TW)

(73) Assignee: Taiwan Semiconductor Manufacturing Company, Ltd., Hsin-Chu (TW)

(21) Appl. No.: 11/494,754

(22) Filed: Jul. 27, 2006

Related U.S. Patent Documents

Reissue of:
(64) Patent No.: 6,830,504
Issued: Dec. 14, 2004
Appl. No.: 10/627,795
Filed: Jul. 25, 2003

(51) Int. Cl.
*B24B 1/00* (2006.01)
*B24D 13/14* (2006.01)

(52) U.S. Cl.
CPC ..... *B24D 13/14* (2013.01)

(58) Field of Classification Search
USPC ..... 451/41, 57, 28, 36; 438/690–693; 51/307–309; 106/3
See application file for complete search history.

(56) References Cited

U.S. PATENT DOCUMENTS 5,676,587 A * 10/1997 Landers et al. ..... 451/57
5,913,712 A * 6/1999 Molinar ..... 451/41
6,126,517 A 10/2000 Tolles et al.
6,217,416 B1 * 4/2001 Kaufman et al. ..... 451/41
6,261,158 B1 * 7/2001 Holland et al. ..... 451/63
6,274,478 B1 8/2001 Farkas et al.
6,313,039 B1 11/2001 Small et al.
6,319,833 B1 * 11/2001 Schonauer et al. ..... 438/687
6,338,744 B1 1/2002 Tateyama et al.
6,376,009 B1 * 4/2002 Bergvall ..... 427/162
6,444,569 B2 9/2002 Farkas et al.
6,447,371 B2 * 9/2002 Brusic Kaufman et al. .... 451/36
6,530,968 B2 3/2003 Tsuchiya et al.
6,555,477 B1 * 4/2003 Lu et al. ..... 438/692
6,573,173 B2 6/2003 Farkas et al.
6,579,798 B2 6/2003 Chatterjee et al.
6,595,832 B2 * 7/2003 Joslyn et al. ..... 451/41
6,709,316 B1 * 3/2004 Sun et al. ..... 451/41
6,736,701 B1 * 5/2004 Shue et al. ..... 451/8
6,740,591 B1 * 5/2004 Miller et al. ..... 438/692
6,749,487 B2 * 6/2004 Okuhata et al. ..... 451/41
2002/0055192 A1 * 5/2002 Redeker et al. ..... 438/8

* cited by examiner

*Primary Examiner* — Robert Rose
(74) *Attorney, Agent, or Firm* — Slater & Matsil, L.L.P.

(57) ABSTRACT

A method of polishing a metal layer comprising the following steps. A structure having an upper patterned dielectric layer with an opening therein is provided. A barrier layer is formed over the patterned upper dielectric layer and lining the opening. A metal layer is formed over the barrier layer, filling the opening. A first polish step employing a first slurry composition is conducted to remove a portion of the overlying metal layer. A second polish step employing the first slurry composition is conducted to: polish the partially removed overlying metal layer; and to expose portions of the barrier layer overlying the patterned upper dielectric layer. A third polish step employing a second slurry composition is conducted to remove the exposed barrier layer portions and exposing underlying portions of the patterned upper dielectric layer. A fourth polish step employing the second slurry composition and BTA is conducted to buff the exposed upper dielectric layer portions.

50 Claims, 2 Drawing Sheets

BARRIER-SLURRY-FREE COPPER CMP PROCESS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

This application is related to co-pending application Ser. No. 10/714,985, filed Nov. 17, 2003, and entitled "Copper CMP Defect Reduction By Extra Slurry Polish".

FIELD OF THE INVENTION

The present invention relates generally to semiconductor fabrication and more specifically to polishing semiconductor metal layers.

BACKGROUND OF THE INVENTION

During metal/copper chemical mechanical polishing processes, three films/materials are encountered. 1) A patterned dielectric layer, usually silicon oxide (oxide), within which an opening is formed; 2) a barrier layer which lines the oxide layer opening and covers the top of the patterned oxide layer; and 3) a metal layer, usually copper, formed over the patterned dielectric layer, filling the barrier lined opening. In order to planarize, or polish, the metal layer to form a planarized metal structure within the barrier lined opening in the dielectric layer, a variety of polishing steps with various slurries are employed.

U.S. Pat. No. 6,217,416 B1 to Kaufman describes a first and second CMP slurry wherein the second slurry includes an abrasive, an oxidizing agent and acetic acid wherein the weight ratio of oxidizing agent/acetic agent is at least 10 and wherein the two slurries are sequentially used in a method to polish a substrate containing copper and containing tantalum or tantalum oxide or both tantalum and tantalum oxide.

U.S. Pat. No. 6,338,744 B1 to Tateyama et al. describe a high purity polishing slurry comprising water and dispersed silica particles.

U.S. Pat. No. 6,261,158 B1 to Holland et al. describes a multi-step CMP system used to polish a wafer to form metal interconnects in a dielectric layer upon which barrier and metal layers have been formed.

U.S. Pat. No. 6,447,371 B2 to Brusic Kaufman et al. describes a chemical mechanical polishing slurry useful for copper/tantalum substrates.

U.S. Pat. No. 6,313,039 B1 to Small et al. describes a chemical mechanical polishing composition and process.

U.S. Pat. No. 6,530,968 B2 to Tsuchiya et al. describes a chemical mechanical polishing slurry.

SUMMARY OF THE INVENTION

Accordingly, it is an object of one or more embodiments of the present invention to provide an improved method of polishing metal layers.

Other objects will appear hereinafter.

It has now been discovered that the above and other objects of the present invention may be accomplished in the following manner. Specifically, a structure having an upper patterned dielectric layer with an opening therein is provided. A barrier layer is formed over the patterned upper dielectric layer and lining the opening. A metal layer is formed over the barrier layer, filling the opening. A first polish step employing a first slurry composition is conducted to remove a portion of the overlying metal layer. A second polish step employing the first slurry composition is conducted to: polish the partially removed overlying metal layer; and to expose portions of the barrier layer overlying the patterned upper dielectric layer. A third polish step employing a second slurry composition is conducted to remove the exposed barrier layer portions and exposing underlying portions of the patterned upper dielectric layer. A fourth polish step employing the second slurry composition and BTA is conducted to buff the exposed upper dielectric layer portions.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Processes Known to the Inventors—Not to be Considered Prior Art

The following metal/copper chemical mechanical polishing processes are known to the inventors and are not to be considered prior art for the purposes of this invention.

For example, when the barrier layer is tantalum nitride (TaN), the dielectric layer is silicon oxide (oxide) and the metal layer is copper (Cu), three polishing options are currently used:

(1) Cu slurry polish->TaN slurry polish (w/or w/o oxide rate);

(2) Cu slurry polish->TaN slurry polish->oxide slurry buff (w/BTA to selectively not remove Cu); and (3) Cu slurry polish->(clean)->TaN dry etch.

However, options (1) and (2) require consumption of an expensive TaN slurry in order to remove the TaN barrier layer from over the top of the patterned oxide layer; and option (3) requires extra dry etch tools to remove the TaN barrier layer from over the top of the patterned oxide layer. The use of either of these three methods makes it difficult to improve the throughput of the Cu CMP process.

Figure 2:
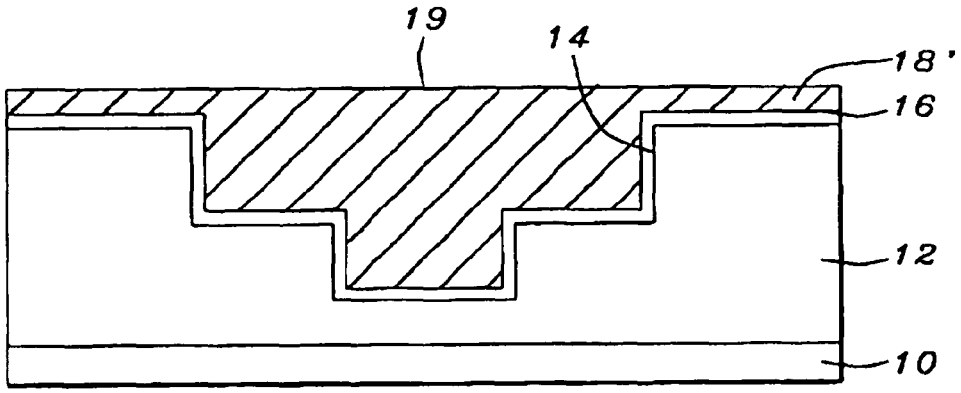

Present Invention—Initial Structure—FIG. 2

Figure 1:
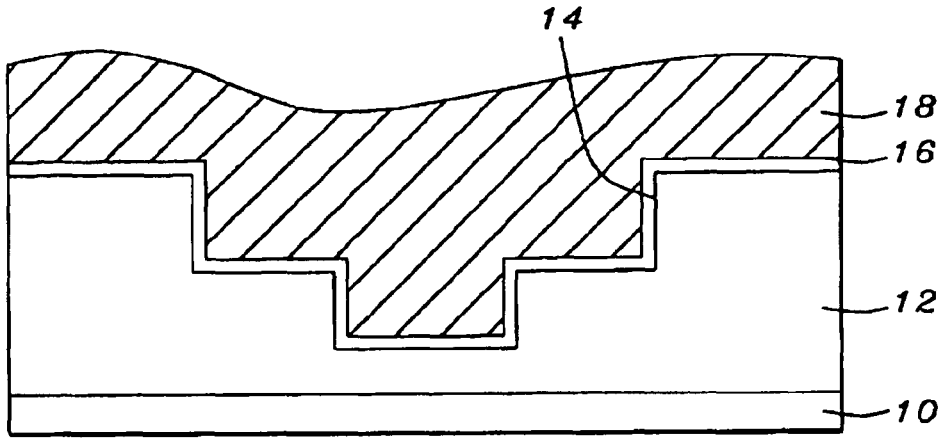
FIGS. 1 to 5 schematically illustrate a preferred embodiment of the present invention.

FIG. 1 illustrates the initial structure of the present invention. Structure 10 includes patterned dielectric layer 12 formed thereover to a thickness of preferably from about 10,000 to 12,000 Åand more preferably about 11,100 Å.

Structure 10 is preferably a silicon substrate and is understood to possibly include a semiconductor wafer or substrate, active and passive devices formed within the wafer, conductive layers and dielectric layers (e.g., interpoly oxide (IPO), intermetal dielectric (IMD), etc.) formed over the wafer surface. The term "semiconductor structure" is meant to include devices formed within a semiconductor wafer and the layers overlying the wafer.

Patterned dielectric layer 12 is preferably comprised of silicon oxide, silicon nitride (SiN), FSG or silicon oxynitride (SiON) and is more preferably silicon oxide.

Patterned dielectric layer 12 includes an opening 14 formed therein which may be a dual damascene opening as shown in the figures.

A barrier layer 16 is preferably formed over patterned dielectric 12, lining opening 14. Barrier layer 16 is preferably formed by electro-chemical plating (ECP) or physical vapor deposition (PVD) and more preferably by physical vapor deposition (PVD).

Barrier layer 16 has a thickness of preferably from about 250 to 350 Å and more preferably about 300 Å. Barrier layer 16 is preferably comprised of TaN or Ta and is more preferably TaN.

A metal layer 18 is then formed over barrier layer 16, at least filling barrier layer-lined-opening 14. Metal layer 18 is preferably formed by electro-chemical plating (ECP).

Metal layer 18 has a thickness of preferably from about 6000 to 8000 Å and more preferably about 7000 Å. Metal layer 18 is preferably comprised of copper (Cu), aluminum (Al) or gold (Au) and is more preferably copper (Cu).

Figure 3:
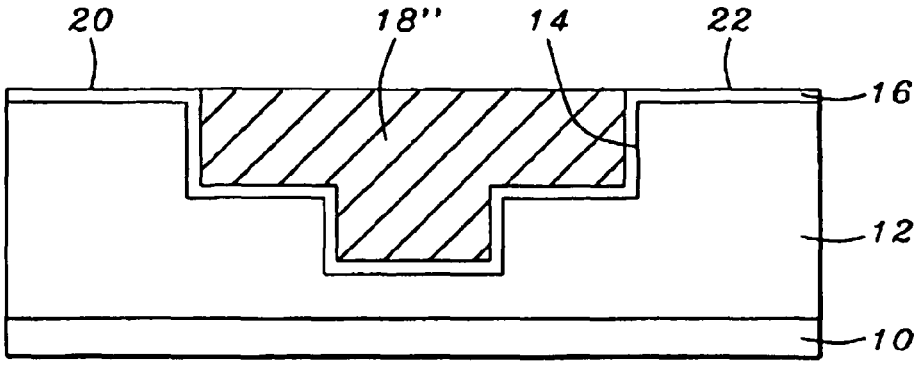
Figure 4:
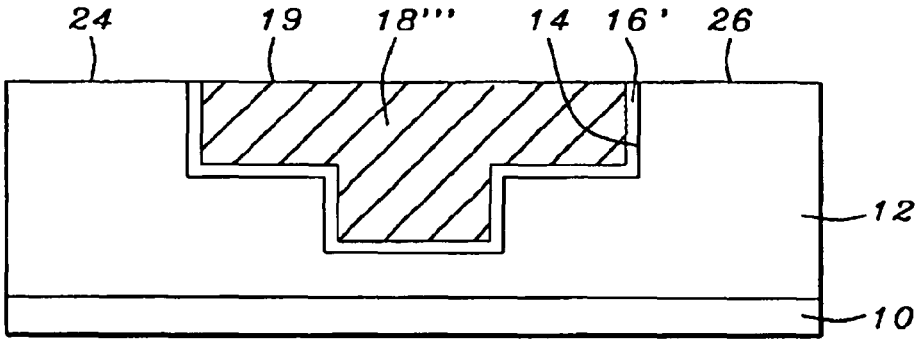

Polishing of Metal Layer 18—FIGS. 2-4

As discovered by the inventors of the present invention, neither a barrier-layer-specific slurry nor a barrier-layer-etch are necessary to remove the barrier layer 16 over the patterned dielectric layer 12. Only two different slurries are needed to polish/remove three different types of films (metal layer 18, barrier layer 16 and patterned dielectric layer 12).

First Step Polish—First Platen —First Slurry Composition—FIG. 2

As shown in FIG. 2, the wafer/structure of FIG. 1 may be placed upon a first platen in a polishing tool and polished with a First Slurry Composition to polish/remove the bulk of metal layer 18 leaving reduced metal layer 18' having a thickness of preferably from about 2000 to 4000 Å and more preferably about 3000 Å above the barrier-layer-16-lined patterned dielectric layer 12.

The First Slurry Composition is comprised of 600y-73 Slurry wherein:

600y-73 Slurry—Cabot copper (Cu) film polishing slurry (manufactured by Cabot Microelectronics, 8A-7, No. 26, Tai-Yuan St., Chu Pei, Hsin Chu Hsien, Taiwan, 203 R.O.C.) comprised of:

$Al_2O_3$: preferably from about 0.4 to 0.6 wt. % and more preferably about 0.5 wt. %;

$H_2O_2$: preferably from about 2.6 to 3.4 wt. % and more preferably from about 2.8 to 3.2 wt. %;

KOH to adjust pH value; and benzotriazole (1-H benzotriazole or BTA) as a corrosion behavior inhibitor;

and having a) pH: preferably from about 2.8 to 4.3 and more preferably about 4.1; and b) size of particles: preferably from about 115 to 155 run, weight basis and more preferably from about 120 to 150 nm, weight basis.

This first, bulk metal layer 18, polish is a high rate, bulk metal removal using an iScan Endpoint (Applied Material real time Cu In Situ Rate Monitor (ISRM) Endpoint System thickness monitor using eddy current to catch polishing end time) at:

(1) preferably from about 2.0 to 2.4 psi and more preferably about 2.2 psi for preferably from about 36 to 44 seconds and more preferably about 40 seconds (by end-point); and then (2) preferably from about 1.0 to 1.4 psi and more preferably about 1.2 psi for preferably from about 18 to 22 seconds and more preferably about 20 seconds (by time).

Second Step Polish—Second Platen—First Slurry Composition—FIG. 3

As shown in FIG. 3, the wafer/structure of FIG. 2 may be transferred to a second platen in the polishing tool and then polished with the First Slurry Composition described above to polish the metal layer 18' surface 19 and to expose the portions 20, 22 of barrier layer 16 overlying the patterned dielectric layer 12.

This second, final metal layer 18" polish/barrier layer 16 exposure, polish is a low pressure polish using Full Scan Endpoint (Applied Material In Situ Rate Monitor (ISRM) Endpoint System using a laser beam to catch polishing end time) at preferably from about 1.0 to 1.4 psi and more preferably about 1.2 psi for preferably from about 41 to 49 seconds and more preferably about 45 seconds (by end-point).

Third Step Polish—Second Platen—Second Slurry Composition—FIG. 4

As shown in FIG. 4, the wafer/structure of FIG. 3 is then polished with a Second Slurry Composition on the second platen to remove the portions 20, 22 of barrier layer 16 overlying the patterned dielectric layer 12 to expose potions 24, 26 of the underlying patterned dielectric layer 12.

The Second Slurry Composition is comprised of SS6 Slurry wherein:

SS6 Slurry—Cabot Semi-Sperse® polishing slurry (also manufactured by Cabot Microelectronics, 8A-7, No. 26, Tai-Yuan St., Chu Pei, Hsin Chu Hsien, Taiwan, 203 R.O.C.) diluted to 25% for solids for polishing comprised of:

$SiO_2$: preferably from about 5.8 to 6.2 wt. % and more preferably about 6.0 wt. %; and KOH to adjust pH value;

and having a) pH: preferably from about 9.8 to 11.4 and more preferably from about 10.0 to 11.2; and b) size of particles: preferably from about 125 to 185 nm, weight basis and more preferably from about 130 to 180 nm, weight basis.

This third polish step is conducted at preferably from about 1.8 to 2.2 psi and more preferably about 2.0 psi for preferably from about 31 to 39 seconds and more preferably about 35 seconds (by time).

Figure 5:
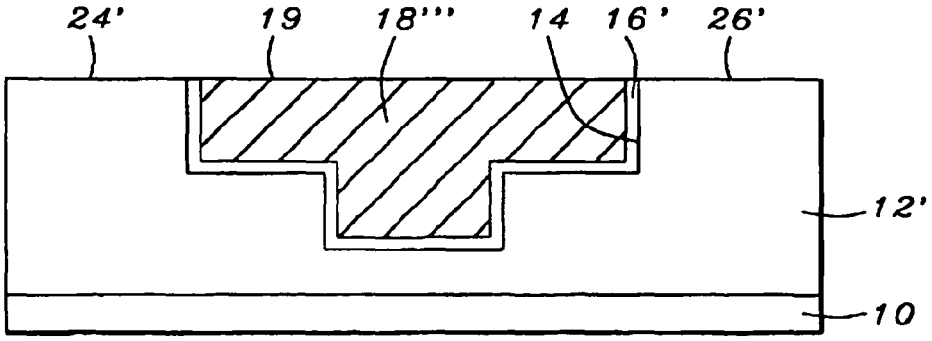

Fourth Step Polish—Third Platen—Second Slurry Composition+BTA—FIG. 5

As shown in FIG. 5, the wafer/structure of FIG. 4 may be transferred to a third platen within the polishing tool and polished with the Second Slurry Composition with BTA to buff the exposed portions 24, 26 of the patterned dielectric layer 12 to form buffed exposed portions 24', 26' of the buffed patterned dielectric layer 12'.

Prom about 0.10 to 0.14% and more preferably about 0.12% benzotriazole (1-H benzotriazole or BTA) (corrosion behavior inhibitor) is added to the SS6 Second Slurry Composition described above as to be selective to polished metal layer 18'" so as to not appreciably remove polished metal layer 18'".

This fourth polish step is conducted at preferably from about 1.8 to 2.2 psi and more preferably about 2.0 psi for preferably from about 40 to 60 seconds and more preferably about 50 seconds (by time).

Further processing may then proceed. For example, the structure of FIG. 5 may be cleaned and a silicon nitride ($Si_3N_4$ or nitride) layer may be deposited.

The inventors have found that besides: (1) being less expensive and simpler that the processes known to the inventors since neither a specific barrier-layer-slurry nor an extra barrier-layer-etch-step are required; and (2) the throughput, i.e. the wafers per hour, is improved; the same performance is achieved when polishing copper metal layers 18 in accordance with their present invention including defects, resistance (Rs) value and stress migration (SM) test. One of the most serious problems in Cu-based multilevel integration is the failures in stacked via resistance caused by stress-induced voids in via holes. So passing the SM test by the structure(s) formed in accordance with the method of the present invention is the index for Cu-based process.

A better slope of pattern density correlating with the Rs value is also achieved as compared to the current processes known to the inventors. Further, when polishing copper metal layers 18 in accordance with their present invention, the inventors have found that dishing, erosion and tiger teeth were appreciably reduced.

Advantages of the Present Invention

The advantages of one or more embodiments of the present invention include:

1. simpler method;
2. less expensive method;
3. improved dishing, erosion and tiger teeth;
4. increased wafers/hour is achieved;
5. SM test passed; and
6. Rs value acceptable.

While particular embodiments of the present invention have been illustrated and described, it is not intended to limit the invention, except as defined by the following claims.

We claim:

1. A method of polishing a metal layer, comprising the steps of:

providing a structure having an upper patterned dielectric layer; the patterned dielectric layer having an opening formed therein;

forming a barrier layer over the patterned upper dielectric layer, the barrier layer lining the opening;

forming a metal layer over the barrier layer, filling the opening;

conducting a first polish step employing a first slurry composition, the first polish step removing a portion of the overlying metal layer;

conducting a second polish step employing the first slurry composition, the second polish step polishing the partially removed overlying metal layer and exposing portions of the barrier layer overlying the patterned upper dielectric layer;

conducting a third polish step employing a second slurry composition, the third polish step removing the exposed barrier layer portions and exposing underlying portions of the patterned upper dielectric layer; and conducting a fourth polish step employing the second slurry composition and BTA, the fourth polish step buffing the exposed upper dielectric layer portions.

2. The method of claim 1, wherein the first polish step is conducted on a first platen; the second and third polish steps are conducted on a second platen; and the fourth polish step is conducted on a third platen.

3. The method of claim 1, wherein the first slurry composition is 600y-73 slurry manufactured by Cabot Microelectronics comprised of:

$Al_2O_3$: from about 0.4 to 0.6 wt. %;
$H_2O_2$: from about 2.6 to 3.4 wt. %;
KOH to adjust pH value; and
BTA as a corrosion behavior inhibitor.

4. The method of claim 1, wherein the first slurry composition is 600y-73 slurry manufactured by Cabot Microelectronics comprised of:

$Al_2O_3$: about 0.5 wt. %;
$H_2O_2$: from about 2.8 to 3.2 wt. %;
KOH to adjust pH value; and
BTA as a corrosion behavior inhibitor.

5. The method of claim 1, wherein the first slurry composition is 600y-73 slurry manufactured by Cabot Microelectronics having:

a) a pH of from about 2.8 to 4.3; and
b) a particulate size of from about 115 to 155 nm, weight basis.

6. The method of claim 1, wherein the first slurry composition is 600y-73 slurry manufactured by Cabot Microelectronics having:

a) a pH of about 4.1; and
b) a particulate size of from about 120 to 150 nm, weight basis.

7. The method of claim 1, wherein the second slurry composition is SS6 slurry manufactured by Cabot Microelectronics comprised of:

$SiO_2$: from about 5.8 to 6.2 wt. %; and
KOH to adjust pH value.

8. The method of claim 1, wherein the second slurry composition is SS6 slurry manufactured by Cabot Microelectronics comprised of:

$SiO_2$: about 6.0 wt. %; and
KOH to adjust pH value.

9. The method of claim 1, wherein the second slurry composition is SS6 slurry manufactured by Cabot Microelectronics having:

a) a pH of from about 9.8 to 11.4; and
b) a particulate size of from about 125 to 185 nm, weight basis.

10. The method of claim 1, wherein the second slurry composition is SS6 slurry manufactured by Cabot Microelectronics having:

a) a pH of from about 10.0 to 11.2; and
b) a particulate size of from about 130 to 180 nm, weight basis.

11. The method of claim 1, wherein the fourth polish step employs the second slurry composition that is SS6 slurry manufactured by Cabot Microelectronics comprised of:

$SiO_2$: from about 5.8 to 6.2 wt. %; and
KOH to adjust pH value;
and from about 0.10 to 0.14% BTA.

12. The method of claim 1, wherein the fourth polish step employs the second slurry composition that is SS6 slurry manufactured by Cabot Microelectronics comprised of:

$SiO_2$: about 6.0 wt. %; and
KOH to adjust pH value;
and about 0.12% BTA.

13. The method of claim 1, wherein the fourth polish step employs the second slurry composition that is SS6 slurry manufactured by Cabot Microelectronics having:

a) a pH of from about 9.8 to 11.4; and
b) a particulate size of from about 125 to 185 nm, weight basis;
and from about 0.10 to 0.14% BTA.

14. The method of claim 1, wherein the fourth polish step employs the second slurry composition that is SS6 slurry manufactured by Cabot Microelectronics having:

a) a pH of from about 10.0 to 11.2; and
b) a particulate size of from about 130 to 180 nm, weight basis;
and about 0.12% BTA.

15. The method of claim 1, wherein:

the first polish step is conducted at from about 2.0 to 2.4 psi for from about 36 to 44 seconds; and then at from about 1.0 to 1.4 psi for from about 18 to 22 seconds;

the second polish step is conducted at from about 1.0 to 1.4 psi for from about 41 to 49 seconds;

the third polish step is conducted at from about 1.8 to 2.2 psi for from about 31 to 39 seconds; and the fourth polish step is conducted at from about 1.8 to 2.2 psi for from about 40 to 60 seconds.

16. The method of claim 1, wherein:

the first polish step is conducted at about 2.2 psi for about 40 seconds; and then at about 1.2 psi for about 20 seconds;

the second polish step is conducted at about 1.2 psi for about 45 seconds;

the third polish step is conducted at about 2.0 psi for about 35 seconds; and the fourth polish step is conducted at about 2.0 psi for about 50 seconds.

17. The method of claim 1, wherein the structure is a semiconductor substrate.

18. The method of claim 1, wherein the upper patterned dielectric layer is comprised of silicon oxide, silicon nitride, FSG or silicon oxynitride; the barrier layer is comprised of TaN or Ta; and the metal layer is comprised of copper aluminum or gold.

19. The method of claim 1, wherein the upper patterned dielectric layer is comprised of silicon oxide; the barrier layer is comprised of TaN; and the metal layer is comprised of copper.

20. The method of claim 1, wherein the patterned dielectric layer is from about 10,000 to 12,000 Å thick; and the barrier layer is from about 250 to 350 Åthick.

21. The method of claim 1, wherein the patterned dielectric layer is about 11,100 Å thick; and the barrier layer is about 300 Å thick.

22. The method of claim 1, wherein the partially removed overlying metal layer has a thickness of from about 6000 to 8000 Å.

23. The method of claim 1, wherein the partially removed overlying metal layer has a thickness of about 7000 Å.

24. A method of polishing a metal layer, comprising the steps of:

providing a structure having an upper patterned dielectric layer; the patterned dielectric layer having an opening formed therein;

forming a barrier layer over the patterned upper dielectric layer, the barrier layer lining the opening;

forming a metal layer over the barrier layer, filling the opening;

conducting a first polish step on a first platen employing a first slurry composition, the first polish step removing a portion of the overlying metal layer;

conducting a second polish step on a second platen employing the first slurry composition, the second polish step polishing the partially removed overlying metal layer and exposing portions of the barrier layer overlying the patterned upper dielectric layer;

conducting a third polish step on the second platen employing a second slurry composition, the third polish step removing the exposed barrier layer portions and exposing underlying portions of the patterned upper dielectric layer; and conducting a fourth polish step on a third platen employing the second slurry composition and BTA, the fourth polish step buffing the exposed upper dielectric layer portions.

25. The method of claim 24, wherein the first slurry composition is 600y-73 slurry manufactured by Cabot Microelectronics comprised of:

$Al_2O_3$: from about 0.4 to 0.6 wt. %;

$H_2O_2$: from about 2.6 to 3.4 wt. %;

KOH to adjust pH value; and

BTA as a corrosion behavior inhibitor.

26. The method of claim 24, wherein the first slurry composition is 600y-73 slurry manufactured by Cabot Microelectronics comprised of:

$Al_2O_3$: about 0.5 wt. %;

$H_2O_2$: from about 2.8 to 3.2 wt. %;

KOH to adjust pH value; and

BTA as a corrosion behavior inhibitor.

27. The method of claim 24, wherein the first slurry composition is 600y-73 slurry manufactured by Cabot Microelectronics having:

a) a pH of from about 2.8 to 4.3; and b) a particulate size of from about 115 to 155 nm, weight basis.

28. The method of claim 24, wherein the first slurry composition is 600y-73 slurry manufactured by Cabot Microelectronics having:

a) a pH of about 4.1; and b) a particulate size of from about 120 to 150 nm, weight basis.

29. The method of claim 24, wherein the second slurry composition is SS6 slurry manufactured by Cabot Microelectronics comprised of:

$SiO_2$: from about 5.8 to 6.2 wt. %; and

KOH to adjust pH value.

30. The method of claim 24, wherein the second slurry composition is SS6 slurry manufactured by Cabot Microelectronics comprised of:

$SiO_2$: about 6.0 wt. %; and

KOH to adjust pH value.

31. The method of claim 24, wherein the second slurry composition is SS6 slurry manufactured by Cabot Microelectronics having:

a) a pH of from about 9.8 to 11.4; and b) a particulate size of from about 125 to 185 nm, weight basis.

32. The method of claim 24, wherein the second slurry composition is SS6 slurry manufactured by Cabot Microelectronics having:

a) a pH of from about 10.0 to 11.2; and b) a particulate size of from about 130 to 180 nm, weight basis.

33. The method of claim 24, wherein the fourth polish step employs the second slurry composition that is SS6 slurry manufactured by Cabot Microelectronics comprised of:

$SiO_2$: from about 5.8 to 6.2 wt. %; and

KOH to adjust pH value;

and from about 0.10 to 0.14% BTA.

34. The method of claim 24, wherein the fourth polish step employs the second slurry composition that is SS6 slurry manufactured by Cabot Microelectronics comprised of:

$SiO_2$: about 6.0 wt. %; and

KOH to adjust pH value;

and about 0.12% BTA.

35. The method of claim 24, wherein the fourth polish step employs the second slurry composition that is SS6 slurry manufactured by Cabot Microelectronics having:

a) a pH of from about 9.8 to 11.4; and
b) a particulate size of from about 125 to 185 nm, weight basis;
and from about 0.10 to 0.14% BTA.

36. The method of claim 24, wherein the fourth polish step employs the second slurry composition that is SS6 slurry manufactured by Cabot Microelectronics having:
a) a pH of from about 10.0 to 11.2; and
b) a particulate size of from about 130 to 180 nm, weight basis;
and about 0.12% BTA.

37. The method of claim 24, wherein:
the first polish step is conducted at from about 2.0 to 2.4 psi for from about 36 to 44 seconds; and then at from about 1.0 to 1.4 psi for from about 18 to 22 seconds;
the second polish step is conducted at from about 1.0 to 1.4 psi for from about 41 to 49 seconds;
the third polish step is conducted at from about 1.8 to 2.2 psi for from about 31 to 39 seconds; and
the fourth polish step is conducted at from about 1.8 to 2.2 psi for from about 40 to 60 seconds.

38. The method of claim 24, wherein:
the first polish step is conducted at about 2.2 psi for about 40 seconds; and then at about 1.2 psi for about 20 seconds;
the second polish step is conducted at about 1.2 psi for about 45 seconds;
the third polish step is conducted at about 2.0 psi for about 35 seconds; and
the fourth polish step is conducted at about 2.0 psi for about 50 seconds.

39. The method of claim 24, wherein the structure is a semiconductor substrate.

40. The method of claim 24, wherein the upper patterned dielectric layer is comprised of silicon oxide, silicon nitride, FSG or silicon oxynitride; the barrier layer is comprised of TaN or Ta; and the metal layer is comprised of copper, aluminum or gold.

41. The method of claim 24, wherein the upper patterned dielectric layer is comprised of silicon oxide; the barrier layer is comprised of TaN; and the metal layer 18 is comprised of copper.

42. The method of claim 24, wherein the patterned dielectric layer is from about 10,000 to 12,000 Å thick; and the barrier layer is from about 250 to 350 Å thick.

43. The method of claim 24, wherein the patterned dielectric layer is about 11,100 Å thick; and the barrier layer is about 300 Å thick.

44. The method of claim 24, wherein the partially removed overlying metal layer has a thickness of from about 6000 to 8000 Å.

45. The method of claim 24, wherein the partially removed overlying metal layer has a thickness of about 7000 Å.

[46. A method of polishing a metal layer, comprising the steps of:
providing a structure having an upper patterned dielectric layer; the patterned dielectric layer having an opening formed therein;
forming a barrier layer over the patterned upper dielectric layer, the barrier layer lining the opening;
forming a metal layer over the barrier layer, filling the opening;
conducting a first polish step employing a first slurry composition, the first polish step removing a portion of the overlying metal layer; wherein the first slurry composition is 600y-73 slurry manufactured by Cabot Microelectronics comprised of:
$Al_2O_3$: from about 0.4 to 0.6 wt. %;
$H_2O_2$: from about 2.6 to 3.4 wt. %;
KOH to adjust pH value; and
BTA as a corrosion behavior inhibitor
conducting a second polish step employing the first slurry composition, the second polish step polishing the partially removed overlying metal layer and exposing portions of the barrier layer overlying the patterned upper dielectric layer;
conducting a third polish step employing a second slurry composition, the third polish step removing the exposed barrier layer portions and exposing underlying portions of the patterned upper dielectric layer; wherein the second slurry composition is SS6 slurry manufactured by Cabot Microelectronics comprised of:
$SiO_2$: from about 5.8 to 6.2 wt. %; and
KOH to adjust pH value; and
conducting a fourth polish step employing the second slurry composition and from about 0.10 to 0.14% BTA, the fourth polish step buffing the exposed upper dielectric layer portions.]

[47. The method of claim 46, wherein the first polish step is conducted on a first platen; the second and third polish steps are conducted on a second platen; and the fourth polish step is conducted on a third platen.]

[48. The method of claim 46, wherein the first slurry composition is comprised of:
$Al_2O_3$: about 0.5 wt. %;
$H_2O_2$: from about 2.8 to 3.2 wt. %;
KOH to adjust pH value; and
BTA as a corrosion behavior inhibitor.]

[49. The method of claim 46, wherein the first slurry composition has:
a) a pH of from about 2.8 to 4.3; and
b) a particulate size of from about 115 to 155 nm, weight basis.]

[50. The method of claim 46, wherein the first slurry composition has:
a) a pH of about 4.1; and
b) a particulate size of from about 120 to 150 nm, weight basis.]

[51. The method of claim 46, wherein the second slurry composition is comprised of:
$SiO_2$: about 6.0 wt. %; and
KOH to adjust pH value.]

[52. The method of claim 46, wherein the second slurry composition has:
a) a pH of from about 9.8 to 11.4; and
b) a particulate size of from about 125 to 185 nm, weight basis.]

[53. The method of claim 46, wherein the second slurry composition has:
a) a pH of from about 10.0 to 11.2; and
b) a particulate size of from about 130 to 180 nm, weight basis.]

[54. The method of claim 46, wherein the fourth polish step employs the second slurry composition comprised of:
$SiO_2$: about 6.0 wt. %; and
KOH to adjust pH value;
and about 0.12% BTA.]

[55. The method of claim 46, wherein the fourth polish step employs the second slurry composition that is SS6 slurry manufactured by Cabot Microelectronics having:
a) a pH of from about 9.8 to 11.4; and
b) a particulate size of from about 125 to 185 nm, weight basis;
and from about 0.10 to 0.14% BTA.]

[56. The method of claim 46, wherein the fourth polish step employs the second slurry composition that is SS6 slurry manufactured by Cabot Microelectronics having:

a) a pH of from about 10.0 to 11.2; and b) a particulate size of from about 130 to 180 nm, weight basis;

and about 0.12% BTA.]

[57. The method of claim 46, wherein:

the first polish step is conducted at from about 2.0 to 2.4 psi for from about 36 to 44 seconds; and then at from about 1.0 to 1.4 psi for from about 18 to 22 seconds;

the second polish step is conducted at from about 1.0 to 1.4 psi for from about 41 to 49 seconds;

the third polish step is conducted at from about 1.8 to 2.2 psi for from about 31 to 39 seconds; and the fourth polish step is conducted at from about 1.8 to 2.2 psi for from about 40 to 60 seconds.]

[58. The method of claim 46, wherein:

the first polish step is conducted at about 2.2 psi for about 40 seconds; and then at about 1.2 psi for about 20 seconds;

the second polish step is conducted at about 1.2 psi for about 45 seconds;

the third polish step is conducted at about 2.0 psi for about 35 seconds; and the fourth polish step is conducted at about 2.0 psi for about 50 seconds.]

[59. The method of claim 46, wherein the structure is a semiconductor substrate.]

[60. The method of claim 46, wherein the upper patterned dielectric layer is comprised of silicon oxide, silicon nitride, FSG or silicon oxynitride; the barrier layer is comprised of TaN or Ta; and the metal layer is comprised of copper aluminum or gold.]

[61. The method of claim 46, wherein the upper patterned dielectric layer is comprised of silicon oxide; the barrier layer is comprised of TaN; and the metal layer 18 is comprised of copper.]

[62. The method of claim 46, wherein the patterned dielectric layer is from about 10,000 to 12,000 Å thick; and the barrier layer is from about 250 to 350 Å thick.]

[63. The method of claim 46, wherein the patterned dielectric layer is about 11,100 Å thick; and the barrier layer is about 300 Å thick.]

[64. The method of claim 46, wherein the partially removed overlying metal layer has a thickness of from about 6000 to 8000 Å. ]

[65. The method of claim 46, wherein the partially removed overlying metal layer has a thickness of about 7000 Å.]

*66. A method of polishing a metal layer, comprising:*

*providing a structure having a patterned dielectric layer, the patterned dielectric layer having an opening formed therein;*

*forming a barrier layer over the patterned dielectric layer, the barrier layer lining the opening;*

*forming a metal layer over the barrier layer, the metal layer filling the opening;*

*conducting a first polish step on a first platen employing a first slurry composition, the first polish step removing a portion of the overlying metal layer and leaving a remaining portion of the metal layer;*

*conducting a second polish step on a second platen employing the first slurry composition, the second polish step removing the remaining portion of the metal layer and exposing portions of the barrier layer;*

*conducting a third polish step on the second platen employing a second slurry composition, the third polish step removing the exposed barrier layer portions; and*

*conducting a fourth polish step employing the second slurry composition, the fourth polish step buffing a portion of the patterned dielectric layer portions.*

*67. The method of claim 66, wherein the fourth polish step further comprises a corrosion inhibitor.*

*68. The method of claim 67, wherein the corrosion inhibitor comprises 1-H benzotriazole.*

*69. The method of claim 67, wherein the corrosion inhibitor comprises BTA.*

*70. The method of claim 66, wherein the fourth polish step is conducted on a third platen.*

* * * * *